US009350382B1

(12) United States Patent
Bauchot et al.

(10) Patent No.: US 9,350,382 B1
(45) Date of Patent: May 24, 2016

(54) PAD ENCODING AND DECODING

(71) Applicant: International Business Machines Corporation, Armonk, NY (US)

(72) Inventors: Frederic J. Bauchot, Saint-Jeannet (FR); Marc Joel Herve Legroux, de Strasbourg Angers (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/947,068

(22) Filed: Nov. 20, 2015

(30) Foreign Application Priority Data

Dec. 19, 2014 (GB) .................................. 1422719.3

(51) Int. Cl.
*H03M 7/00* (2006.01)
(52) U.S. Cl.
CPC ..................................... *H03M 7/005* (2013.01)
(58) Field of Classification Search
CPC ......... H03M 7/005; H03M 5/00; H03M 7/30; H03M 7/3088
USPC ................................................. 341/51, 87, 90
See application file for complete search history.

(56) References Cited

U.S. PATENT DOCUMENTS

| 4,555,805 | A | 11/1985 | Talbot | |
|---|---|---|---|---|
| 4,602,283 | A | 7/1986 | Corgnier et al. | |
| 6,014,733 | A | 1/2000 | Bennett | |
| 6,737,994 | B2 * | 5/2004 | Davis | H03M 7/30 341/50 |
| 6,876,774 | B2 * | 4/2005 | Satoh | H03M 7/3084 341/51 |
| 7,327,293 | B2 * | 2/2008 | Foster | H03M 7/30 341/102 |
| 8,311,222 | B2 | 11/2012 | Rawson, Sr. | |
| 8,340,162 | B2 | 12/2012 | Tzannes | |
| 8,467,533 | B2 | 6/2013 | Hammersmith | |

(Continued)

FOREIGN PATENT DOCUMENTS

| CN | 102025482 A | 4/2011 |
|---|---|---|
| CN | 103023653 A | 4/2013 |

(Continued)

OTHER PUBLICATIONS

Computer Security CS 426 Lecture 3, "Cryptography: One time Pad, Information Theoretical Security, and Stream CIphers," Fall 2010, 19 pages, CS426, URL:https://www.cs.purdue.edu/homes/ninghui/courses/426_Fall10/handouts/426_Fall10_lect03.pdf.

(Continued)

*Primary Examiner* — Khai M Nguyen
(74) *Attorney, Agent, or Firm* — Douglas A. Lashmit; Hoffman Warnick LLC

(57) ABSTRACT

A system, method and computer program product for encoding an input string of binary characters representing alphanumeric characters. A system includes: a register for storing a two dimensional cellular shape definition including a starting empty cell; a character writing engine for writing a binary character to an empty cell with a predefined initial position; a next cell determination engine for determining a next empty cell by methodically traversing neighboring cells in the two dimensional shape until an empty cell is located; a loop facilitator for looping back to the character writing engine and the next cell determining engine until there are no more data characters or a next empty cell is not determined; and a serialization engine for methodically serializing the two dimensional cells into a one dimensional binary string of characters representing an encoded string of alphanumeric characters.

20 Claims, 14 Drawing Sheets

(56) References Cited

U.S. PATENT DOCUMENTS

| | | |
|---|---|---|
| 8,670,560 B2 | 3/2014 | Cheddad et al. |
| 8,687,810 B2 | 4/2014 | Bukshpun et al. |
| 2003/0118186 A1 | 6/2003 | Gilley |
| 2009/0063431 A1 | 3/2009 | Erol et al. |
| 2009/0100048 A1 | 4/2009 | Hull et al. |
| 2010/0281256 A1 | 11/2010 | Farrugia et al. |
| 2012/0011360 A1 | 1/2012 | Engels et al. |
| 2012/0082310 A1 | 4/2012 | Rashkovskiy et al. |
| 2013/0232305 A1 | 9/2013 | Cuthberth, II et al. |
| 2014/0105382 A1 | 4/2014 | Liu |

FOREIGN PATENT DOCUMENTS

| | | |
|---|---|---|
| CN | 103684742 A | 3/2014 |
| EP | 0089632 A1 | 9/1983 |
| EP | 0304217 A2 | 2/1989 |
| EP | 0445290 B1 | 3/1997 |
| GB | 1295572 | 11/1972 |
| WO | 2010046104 A2 | 4/2010 |
| WO | 2014082090 A1 | 5/2014 |

OTHER PUBLICATIONS

Great Britain Intellectual Property Office, Search Report under Section 17(5), for Application No. GB1422719.3, completed Jul. 3, 2015, 3 pages.

Great Britain Intellectual Property Office, Search Report under Section 17(5), for Application No. GB1422717.7 completed Jul. 3, 2015, 3 pages.

Great Britain Intellectual Property Office, Search Report under Section 17(5), for Application No. GB1422717.4 completed Jul. 19, 2015, 4 pages.

Bhattasali, "LICRYPT: Lightweight Cryptography Technique for Securing Smart Objects in Internet of Things Environment," May 2013, 3 pages, CSI Communications, www.csi-india.org.

Internet Archive WaybackMachine, rick's blog, "Stream Clipers," Jun. 2007, 8 pages, Cryptosmith, Security, Tech Teaching, http://cryptosmith.com/2007/06/07/stream-ciphers/.

Wikipedia, the free encyclopedia, "One-time pad," retrieved from https://en.wikipedia.org/wiki/one-time_pad/, Aug. 2015, 6 pages.

Wikipedia, the free encyclopedia, "Sinc filter," retrieved from https://en.wikipedia.org/wiki/Sinc_filter/, Aug. 2015, 2 pages.

* cited by examiner

Pad Encoding and Decoding Module 200

Two Dimensional Shape Definition Data 202

Character Reading and Writing Engine 204

Next Cell Determination Engine 206

Loop Facilitator 208

Serialization Deserialization Engine 210

Pad Encoding Method 300

Pad Decoding Method 400

FIGURE 2

Pad Encoding Method 300

Step 301 Acquire input string of binary characters representing a string of alphanumeric characters Step 302 Define two dimensional shape with cells and starting parameters including a cell initial position (IP)

Step 304 Write a binary character to a current empty cell in two dimensional shape Step 306 Determine a next current empty cell by methodically traversing from the current empty cell to adjacent cells in the shape.

Step 308 loop back until there are no more empty cells or a next cell is not determined in a finite period Step 310 Methodically serialize two dimensional cellular structure into one dimensional string of binary characters representing a coded string of alphanumeric characters

FIGURE 3A

Pad Decoding Method 400

Step 401 Acquire binary input string of binary characters representing a coded string of alphanumeric characters Step 402 Get two dimensional cellular structure definition and starting parameters including a cell initial position Step 403 Methodically write binary input string into two dimensional cellular structure.

Step 404 Replace binary character from current cell of two dimensional shape with an idle character, write binary character into output string.

Step 406 Determine a next current cell by methodically traversing from the current cell to adjacent cells in the shape to find a non-traversed or idle cell Step 408 loop back until there are no non-traversed data cells or a next cell is not determined in a finite period Step 410 Binary output string represents decoded string of alphanumeric characters

FIGURE 4A

Example A

| Raw Stream | | Coded Stream | |
|---|---|---|---|
| 0 | 0000 | 0000 | 0 |
| 1 | 0001 | 0001 | 1 |
| 2 | 0010 | 0001 | 1 |
| 3 | 0011 | 0110 | 6 |
| 4 | 0100 | 1111 | F |
| 5 | 0101 | 0110 | 6 |
| 6 | 0110 | 1111 | F |
| 7 | 0111 | 0001 | 1 |
| 8 | 1000 | 0011 | 3 |
| 9 | 1001 | 1001 | 9 |
| A | 1010 | 0111 | 7 |
| B | 1011 | 1011 | B |
| C | 1100 | 1010 | A |
| D | 1101 | 0000 | 0 |
| E | 1110 | 1101 | D |
| F | 1111 | 0101 | 5 |

FIGURE 5A

Initial Position (IP) = 1
Initial Direction (ID) = East
TD = East
ED = East
Pad Width (PW) = 8
Pad Height (PH) = 8
String Size (SS) = 64

PAD ENCODING AND DECODING

FIELD OF THE INVENTION

This invention relates to a method and apparatus for encoding and decoding data. In particular the invention relates to a method and apparatus for encoding and decoding data using a two dimensional pad.

BACKGROUND

The trend for encoding and decoding text is to use ever more complex algorithms. To this extent, increasing processing power is required to encode and decode. The logical consequence of this to use dedicated hardware components but this still uses stringent computer resources (memory, computer processing cycles) and more powerful energy sources.

Mobile devices often have more constrained resources than a desktop counterpart but often mobile applications only need a low level of encoding. For instance, field sensors and actuators would benefit from a system which presents a good trade-off between: reduced power consumption; computer resource; and security strength.

SUMMARY OF INVENTION

In a first aspect of the invention there is provided a system for encoding an input string of binary characters representing alphanumeric characters, comprising: a two dimensional cellular shape definition including a starting empty cell; a character writing engine for writing a binary character to an empty cell beginning with the starting empty cell; a next cell determination engine for determining a next empty cell by methodically traversing neighboring cells in the two dimensional shape until an empty cell is located; a loop facilitator for looping back to the character writing engine and the next cell determining engine until there are no more data characters or a next empty cell is not determined; and a serialization engine for methodically serializing the two dimensional cells into a one dimensional binary string of characters representing an encoded string of alphanumeric characters.

In a second aspect of the invention there is provided a method of encoding an input string of binary characters representing alphanumeric characters, comprising: defining a two dimensional shape of regular cells including a starting empty cell; writing a binary character to an empty cell beginning with the starting empty cell; determining a next empty cell by methodically neighboring cells in the two dimensional shape until an empty cell is located; looping back to the writing next character step and the determining next cell step until there are no more data characters or a next empty cell is not determined; and methodically serializing the two dimensional cells into a one dimensional binary string of characters representing an encoded string of alphanumeric characters.

In a third aspect of the present invention there is provided a method of decoding an input string of binary characters representing an encoded string of alphanumeric characters, comprising: defining a two dimensional shape of regular cells including a starting current cell; populating the cells with the binary characters using a defined transform so that each populated cell is full; reading a binary character from the current cell beginning with the starting current cell; writing it to an output string, and setting the current cell to empty; determining a next full cell by methodically traversing from the current cell to adjacent cells in the two dimensional shape until a full cell is located; looping back to the reading next character step and the determining next cell step until there are no more data characters or a next full cell is not determined; and methodically serializing the two dimensional cells into a one dimensional binary string of characters representing an encoded string of alphanumeric characters.

In a fourth aspect of the invention there is provided a computer program product comprising a computer-readable storage medium having computer-readable program code embodied therewith, the computer-readable program code configured to perform a method for encoding an input string of binary characters representing alphanumeric characters when executed by a computer system, the method comprising: defining a two dimensional shape of regular cells including a starting empty cell; writing a binary character to an empty cell beginning with the starting empty cell; determining a next empty cell by methodically neighboring cells in the two dimensional shape until an empty cell is located; looping back to the writing next character step and the determining next cell step until there are no more data characters or a next empty cell is not determined; and methodically serializing the two dimensional cells into a one dimensional binary string of characters representing an encoded string of alphanumeric characters.

BRIEF DESCRIPTION OF THE DRAWINGS

Embodiments of the present invention will now be described, by way of example only, with reference to the following drawings.

FIG. 2 is a component diagram according to an embodiment.

FIG. 3A is a flow diagram of a process of the encoding method according to an embodiment.

FIG. 4A is a flow diagram of a process of the decoding method according to an embodiment.

FIG. 5A is an example diagram of raw stream characters and coded stream characters.

FIG. 5B is an example diagram of initial parameters used to code the example of FIG. 5A.

FIGS. 7A and 7B are state diagrams of the example pad as it is used to decode the coded stream of FIG. 5B.

DETAILED DESCRIPTION

Figure 1:
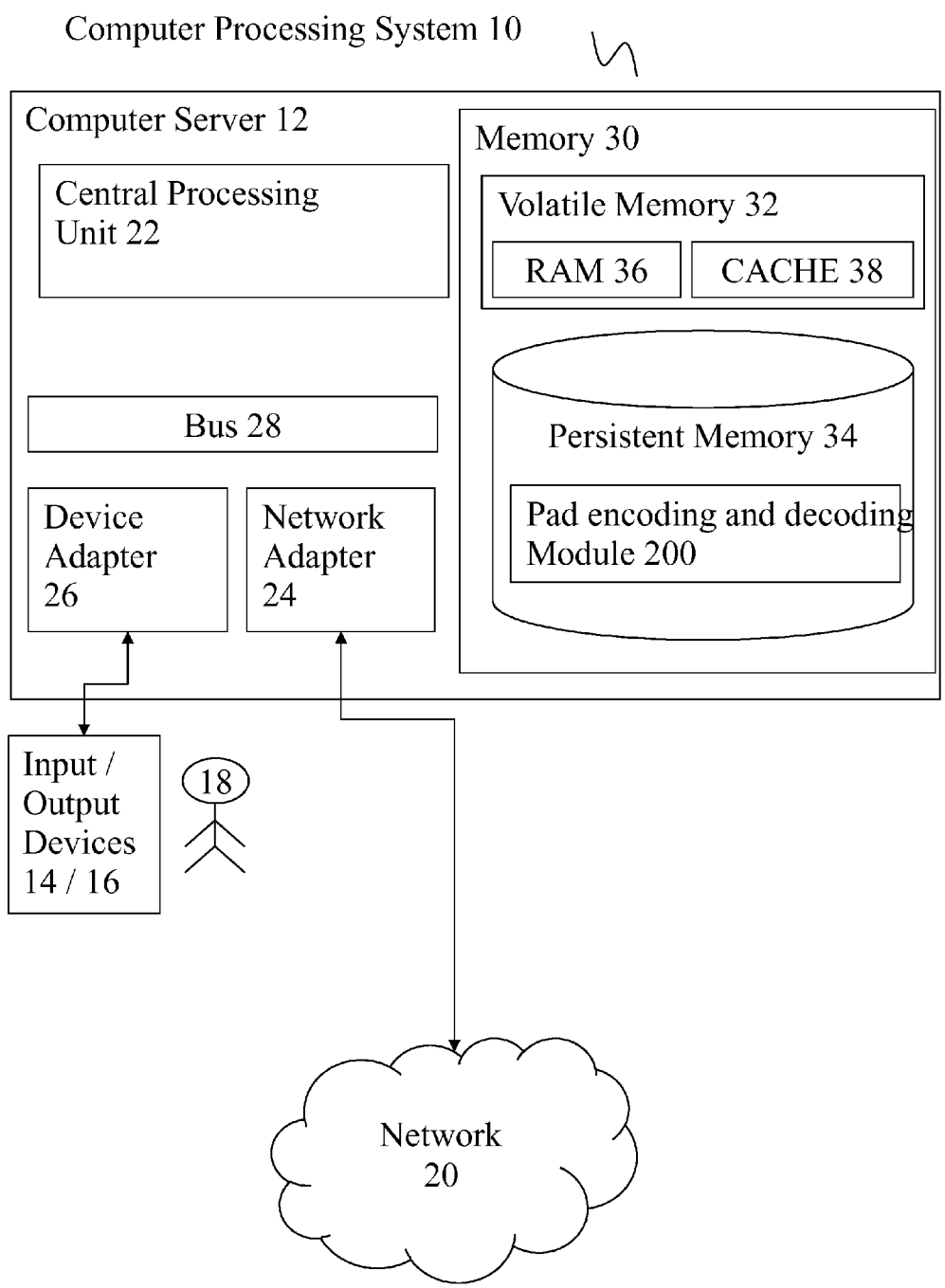
FIG. 1 is a deployment diagram according to an embodiment.

Referring to FIG. 1, the deployment of an embodiment in computer processing system 10 is described. Computer processing system 10 is operational with numerous other general purpose or special purpose computing system environments or configurations. Examples of well-known computing processing systems, environments, and/or configurations that may be suitable for use with computer processing system 10 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed computing environments that include any of the above systems or devices. A distributed computer environment includes a cloud computing environment for example where a computer processing system is a third party service performed by one or more of a plurality computer processing systems. A distributed computer environment also includes an Internet of things computing environment for example where a computer processing systems are distributed in a network of objects that can interact with a computing service.

Computer processing system 10 may be described in the general context of computer system-executable instructions, such as program modules, being executed by a computer processor. Generally, program modules may include routines, programs, objects, components, logic, and data structures that perform particular tasks or implement particular abstract data types. Computer processing system 10 may be embodied in distributed cloud computing environments where tasks are performed by remote processing devices that are linked through a communications network. In a distributed cloud computing environment, program modules may be located in both local and remote computer system storage media including memory storage devices.

The computer program product comprises a series of computer-readable instructions either fixed on a tangible medium, such as a computer readable medium, for example, optical disk, magnetic disk, solid-state drive or transmittable to a computer system, using a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described.

Computer processing system 10 comprises: general-purpose computer server 12 and one or more input devices 14 and output devices 16 directly attached to the computer server 12. Computer processing system 10 is connected to a network 20. Computer processing system 10 communicates with a user 18 using input devices 14 and output devices 16. Input devices 14 include one or more of: a keyboard, a scanner, a mouse, trackball or another pointing device. Output devices 16 include one or more of a display or a printer. Computer processing system 10 communicates with network devices (not shown) over network 20. Network 20 can be a local area network (LAN), a wide area network (WAN), or the Internet.

Computer server 12 comprises: central processing unit (CPU) 22; network adapter 24; device adapter 26; bus 28 and memory 30.

CPU 22 loads machine instructions from memory 30 and performs machine operations in response to the instructions. Such machine operations include: incrementing or decrementing a value in a register; transferring a value from memory 30 to a register or vice versa; branching to a different location in memory if a condition is true or false (also known as a conditional branch instruction); and adding or subtracting the values in two different registers and loading the result in another register. A typical CPU can perform many different machine operations. A set of machine instructions is called a machine code program, the machine instructions are written in a machine code language which is referred to a low level language. A computer program written in a high level language needs to be compiled to a machine code program before it can be run. Alternatively a machine code program such as a virtual machine or an interpreter can interpret a high level language in terms of machine operations.

Network adapter 24 is connected to bus 28 and network 20 for enabling communication between the computer server 12 and network devices.

Device adapter 26 is connected to bus 28 and input devices 14 and output devices 16 for enabling communication between computer server 12 and input devices 14 and output devices 16.

Bus 28 couples the main system components together including memory 30 to CPU 22. Bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Memory 30 includes computer system readable media in the form of volatile memory 32 and non-volatile or persistent memory 34 which may include, in one embodiment, read-only (ROM). Examples of volatile memory 32 are random access memory (RAM) 36 and cache memory 38. Generally volatile memory is used because it is faster and generally non-volatile memory is used because it will hold the data for longer. Computer processing system 10 may further include other removable and/or non-removable, volatile and/or non-volatile computer system storage media. By way of example only, persistent memory 34 can be provided for reading from and writing to a non-removable, non-volatile magnetic media (not shown and typically a magnetic hard disk or solid-state drive). Although not shown, further storage media may be provided including: an external port for removable, non-volatile solid-state memory; and an optical disk drive for reading from or writing to a removable, non-volatile optical disk such as a compact disk (CD), digital video disk (DVD) or Blu-ray. In such instances, each can be connected to bus 28 by one or more data media interfaces. As will be further depicted and described below, memory 30 may include at least one program product having a set (for example, at least one) of program modules that are configured to carry out the functions of embodiments of the invention.

The set of program modules configured to carry out the functions of the embodiments described herein comprises pad encoding and decoding module 200. In one embodiment, ROM in the memory 30 stores module 200 that enables the computer server 12 to function as a special purpose computer specific to the module 200. Further program modules that support the embodiments described herein but are not shown include firmware, boot strap program, operating system, and support applications. Each of the operating system, support applications, other program modules, and program data or some combination thereof, may include an implementation of a networking environment.

Computer processing system 10 communicates with at least one network 20 (such as a local area network (LAN), a general wide area network (WAN), and/or a public network like the Internet) via network adapter 24. Network adapter 24 communicates with the other components of computer server 12 via bus 28. It should be understood that although not shown, other hardware and/or software components could be used in conjunction with computer processing system 10. Examples, include, but are not limited to: microcode, device drivers, redundant processing units, external disk drive arrays, redundant array of independent disks (RAID), tape drives, and data archival storage systems.

Referring to FIG. 2, pad encoding and decoding module 200 comprises the following components: a register 202 for storing two dimensional shape definition data; character reading and writing engine 204; next cell determination engine 206; loop facilitator 208; serialization de-serialization engine 210; pad encoding method 300 and pad decoding method 400.

Register 202 is for storing two dimensional shape definition data that is for defining the two dimensional shape used for the encoding and decoding method.

Character reading and writing engine 204 is for reading characters from and writing characters to the two dimensional shape.

Next cell determination engine 206 is for determining the next cell in the two dimensional shape.

Loop facilitator 208 is for looping between the character reading and writing engine 204 and the next cell determination engine 206.

Serialization de-serialization engine 210 is for serializing and de-serializing the two dimensional shape into and from serial data.

Pad encoding method 300 controls the main coding process.

Pad decoding method 400 controls the main decoding process.

Figure 3B:
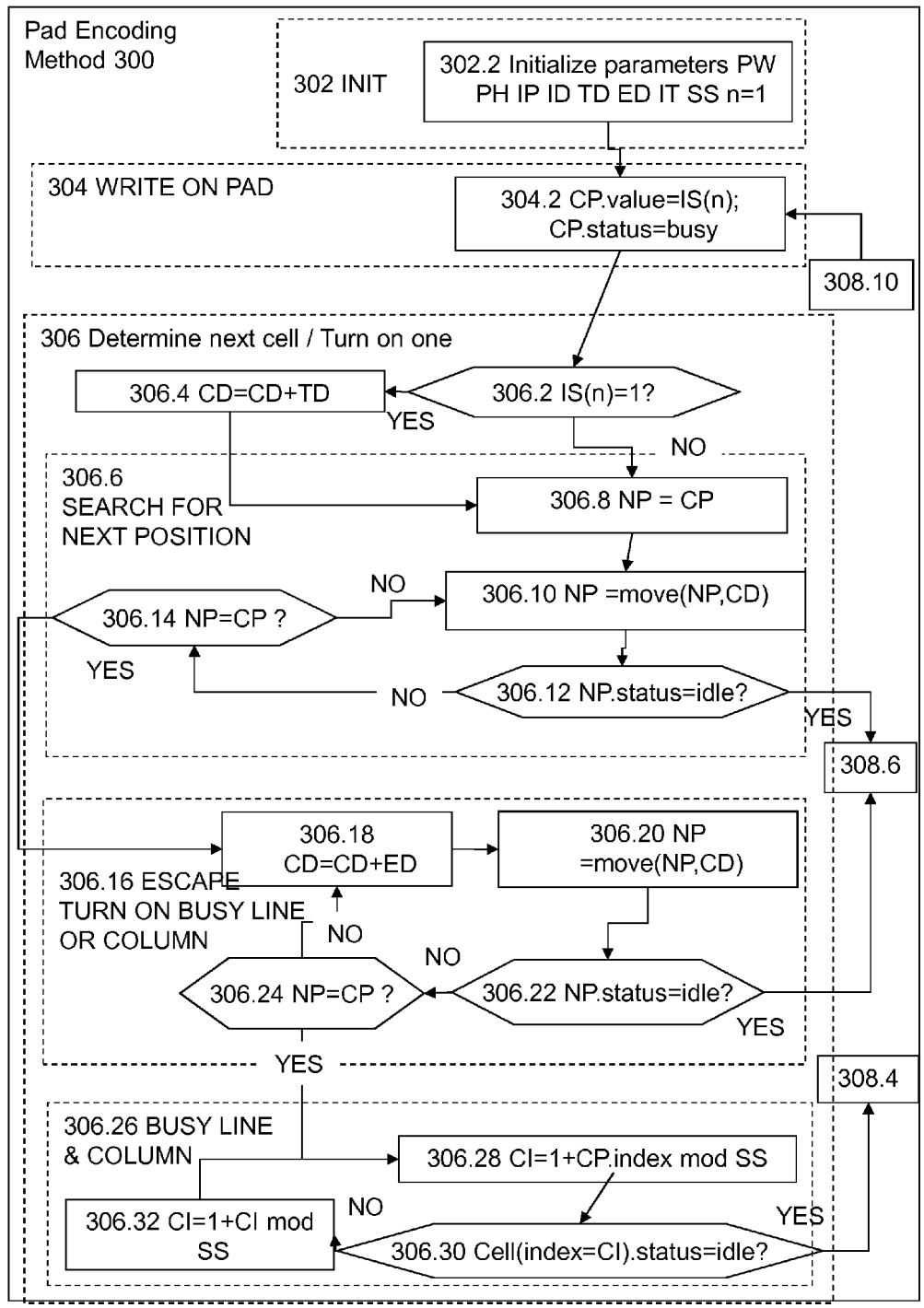
FIGS. 3B and 3C are flow diagrams of an example of the process of the encoding method according to an embodiment.
Figure 3C:
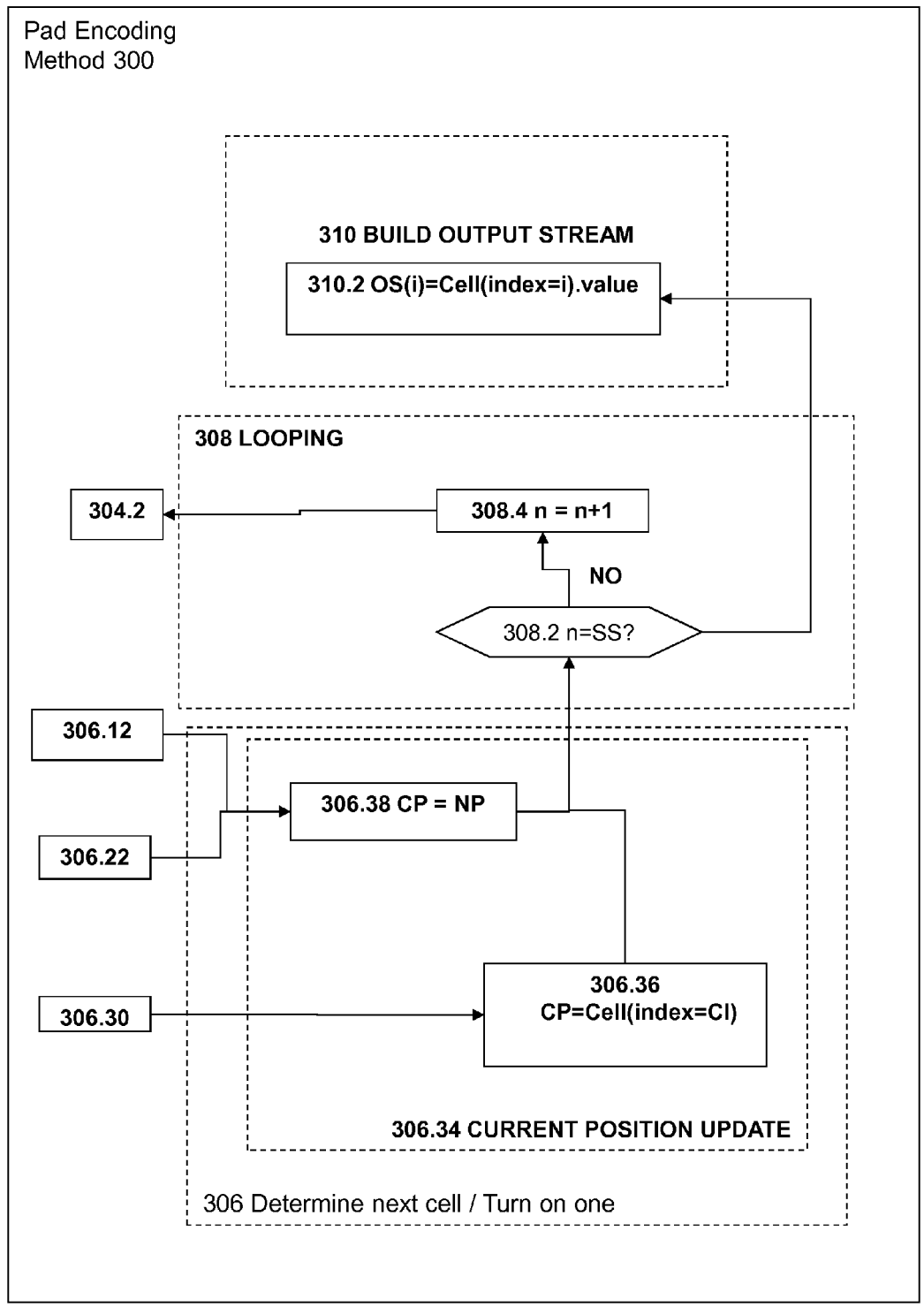

Referring to FIG. 3A, pad encoding method 300 comprises logical process steps 301 to 310 of an embodiment with corresponding logical process sub-steps 302.2 to 310.2 describing further detail of the embodiment with respect to FIGS. 3B and 3C. Pad encoding method 300 starts when a user selects some text or data and then selects that encoding method 300 be executed on the selected text.

Step 301 is for acquiring an input string of binary characters representing a string of alphanumeric characters.

Step 302 is for defining, in an initialization of the method, a two dimensional cellular shape having a defined cell initial position (IP) (a starting cell) and other starting parameters such an initial direction (ID). In the embodiment, the shape of called a pad having width of cells (pad width (PW) and height of cells (pad height (PD)). An example of this step is step 302.2.

Step 304 is for writing a binary character to an empty or idle cell in the two dimensional shape initially at the cell initial position (IP). At the beginning of the process, all positions have a status <<idle>> and are turned <<busy>> once they are filled by an input bit. An example of this step is step 304.2.

For example, a pad shaped two dimensional shape is filled bit by bit, following the sequence of input bits, starting with an initial position (IP) and an initial direction (ID). At each step, the nth input bit is filled in the nth "Current Position" (CP) associated to a "Current Direction" (CD).

Step 306 is for determining the next idle cell and initially generally for looking for a condition in the input string whereby the current direction is to be changed, in the detailed embodiment the direction turns on one. An example of this step is step 306.2 to step 306.38.

For example, if the CP is filled by a "1", then a "Turn Direction" (TD) is applied to the CD. After filling CP, the method searches for the next CP being the first idle position following the CD (looping on pad edge)—if it exists. If it does not exist (no idle cells or positions) then an <<Escape Direction>> (ED) is applied to CD, resuming to the previous logic. If still not found, the next CP corresponds to the next idle position following the index sequence with looping if needed.

Step 308 is for looping back to the writing a cell and determining next cell steps until there are no more data cells or a next cell is not determined in a finite period. in which case the process moves to step 310 to build a serialized output stream. An example of this step is step 308.2 and 308.4.

Step 310 is for building an output stream and comprises step 310.2. For example, at the end of the process, all left idle positions are ignored (apply only if SS<PW*PH. The ciphered <<Output String>> (OS) is made by the sequence of pad rows.

Referring to FIGS. 3B and 3C example logical process steps 302.2 to 310.2 of the embodiment are described.

Step 302.2 is for defining details of the two dimensional shape including initial values for: initial position (IP); initial direction (ID); turn direction (TD); escape direction (ED); index table (IT) and string size (SS). The input string (IS) is measured for a length and the measurement value stored as <<String Size>> (SS). The pad dimension is specified by a <<Pad Width>> (PW) and a <<Path Height>> (PH). SS needs to be less than or equal to the numbers of cells in the two dimensional shape and in a rectangular shape having width and height SS needs to be less than or equal to PW multiplied by PH. Each position of the two dimensional shape is identified with an index specified in an <<Index Table>> (IT) Each position of the input string is indexed by n and the initial value of n is one. Next step 304.2.

Step 304.2 is for setting the value of the current position (CP) to the Input Strings nth character. The status of the current position CP is set from idle to busy.

Step 306.2 is for checking if the input string character IS(n) is "1" and moving to step 306.4 if so but step 306.6 and 306.8 if not. The example in the detail embodiment is a binary string but any number base or string character can be used as long as there is a condition of that allows for a change of direction.

Step 306.4 for changing the direction by adding a directional unit (in this case TD) to the current direction (CD).

Step 306.6 is for searching for the next position and comprises steps 306.8 to 306.14.

Step 306.8 is for setting a next position (NP) to the current position (CP).

Step 306.10 is for setting the next position as a function of the existing next position and the current direction.

Step 306.12 is for checking if the next position status is idle and moving to step 308.6 if so else branching to step 306.14.

Step 306.14 is for checking if the next position has reverted to the current position and branching to step 306.16 and 306.18 if so else branching back to step 306.10

Step 306.16 is for escaping a turn for a busy line or column after a few too many turns resulting in a continuous loop that would loop without finding a new cell that is idle or not being used already. Step 306.16 comprises steps 306.18 to 306.24.

Step 306.18 is for changing the current direction (CD) by an escape direction (ED)

Step 306.20 is for changing the next position as a function of the position and the current direction (having being changed by the extended direction).

Step 306.22 is for moving to step 308.6 if the next position is idle otherwise the method continues at step 306.24.

Step 306.24 is for branching to step 306.28 if the next position is the current position checking otherwise method continues at step 306.18.

Step 306.26 is for further escaping a turn for a busy line or column after too many turns resulting in a continuous loop that would continuous loop without finding a new cell that is idle or not being used already. Step 306.26 comprises three sub steps 306.28, 306.30 and 306.32.

Step 306.28 is for setting a current index (CI) to a function of the current position (CP) and the string size. For example, CI=1+CP.index mod SS.

Step 306 30 is for branching to step 308.4 if the cell status for the current index CI is idle otherwise the method continues at step 306.32.

Step 306.32 is for incrementing the current index and then looping back to step 306.28 to find a cell that is idle and ready for writing.

Step 306.34 is for updating the current position and comprising steps 306.36 and 306.38.

Step 306.36 is for setting the current position to the cell with the current index when the method passes from step 306.30. Next step 308.2

Step 306.38 is for setting the current position to the new position when the method passes from step 306.12 or step 306.22. Next step 308.2.

Step 308.2 is for branching to step 310.2 is the number of characters in the string have been reached. Else step 308.4.

Step 308.4 is for incrementing character counter n. Next step 304.2.

Step 310.2 is for traversing through each cell in the two dimensional shape in a predetermined order and writing the value of each cell to a linear output string (OS). For example, this can be represented by output string (i)=cell(index=i).value.

Figure 4B:
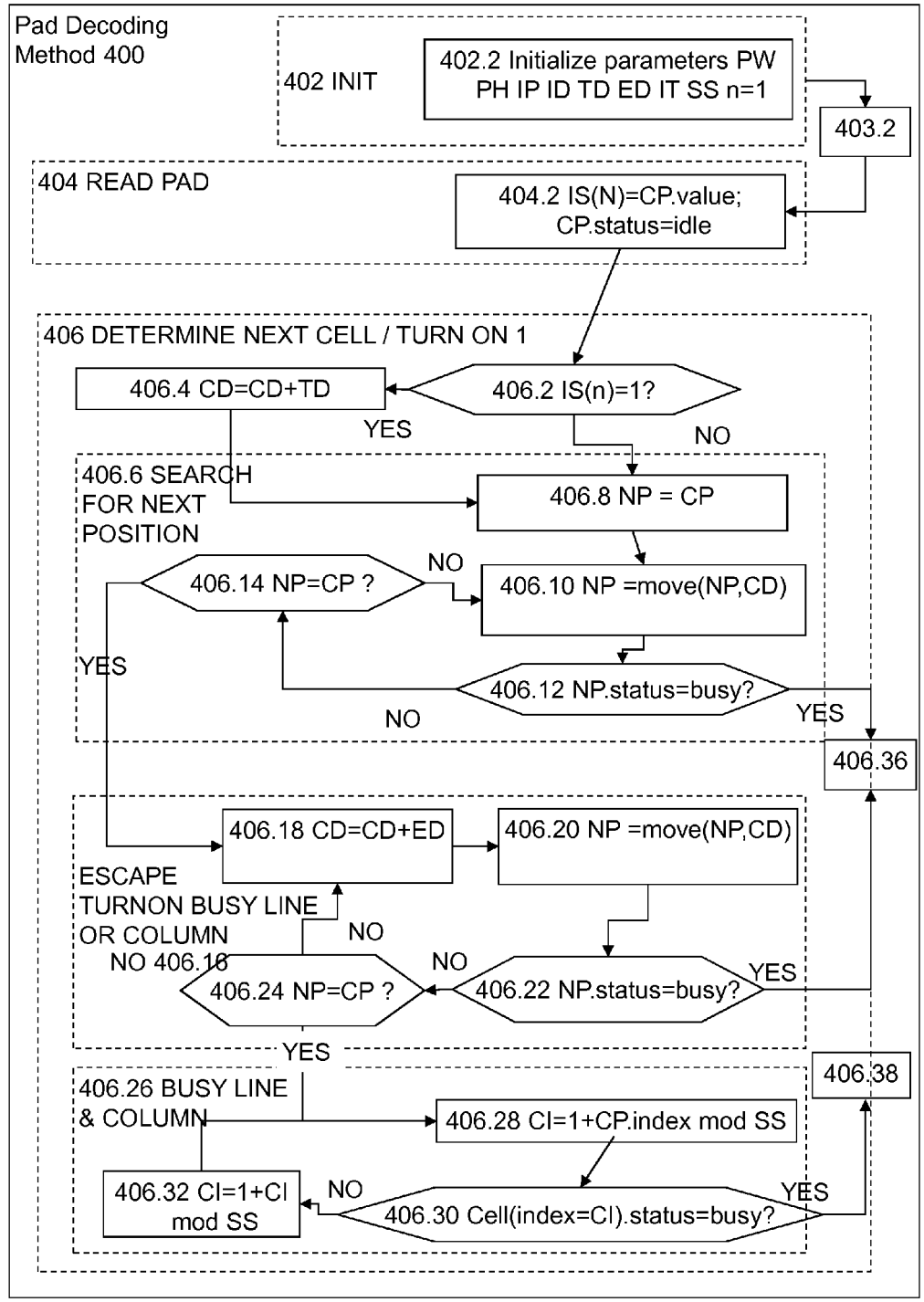
FIGS. 4B and 4C are flow diagrams of an example process of the decoding method according to an embodiment.

Referring to FIG. 4A pad decoding method 400 comprises logical process steps 401 to 410 of the embodiment. Corresponding logical process sub-steps 402.2 to 410.2 describe an example of the embodiment with respect to FIGS. 4B and 4C. Pad decoding method 400 starts when a user selects some text or data and then selects that pad decoding method 400 be executed on the selected text.

Step 401 is for acquiring a binary input string of binary characters representing a coded string of alphanumeric characters.

Step 402 is for acquiring in an initialization of the method, a two dimensional shape in the embodiment called a pad having width of cells (pad width (PW)) and height of cells (pad height (PD)). An example of this step is step 402.2.

Step 403 is for reading an output stream and for filling a two dimensional shape. An example of this step is step 403.2.

Step 404 is for reading a character to a cell in the two dimensional shape initially at the initial position (IP). At the beginning of the process, all positions have a status <<idle>> and are turned <<busy>> once they are filled by an input bit. An example of this step is step 404.2.

Step 406 is for determining the next cell and initially generally for looking for a condition in the input string whereby the current direction is to be changed, in the detailed embodiment the direction turns on one. An example of this step are steps 406.2 to 406.38.

Step 408 is for looping back to the reading a cell and determining next cell steps until there are no more data cells or a next cell is not determined in a finite period. in which case the process moves to step 410 to build a serialized output stream. An example of this step are steps 408.2 and 408.4.

Figure 4C:
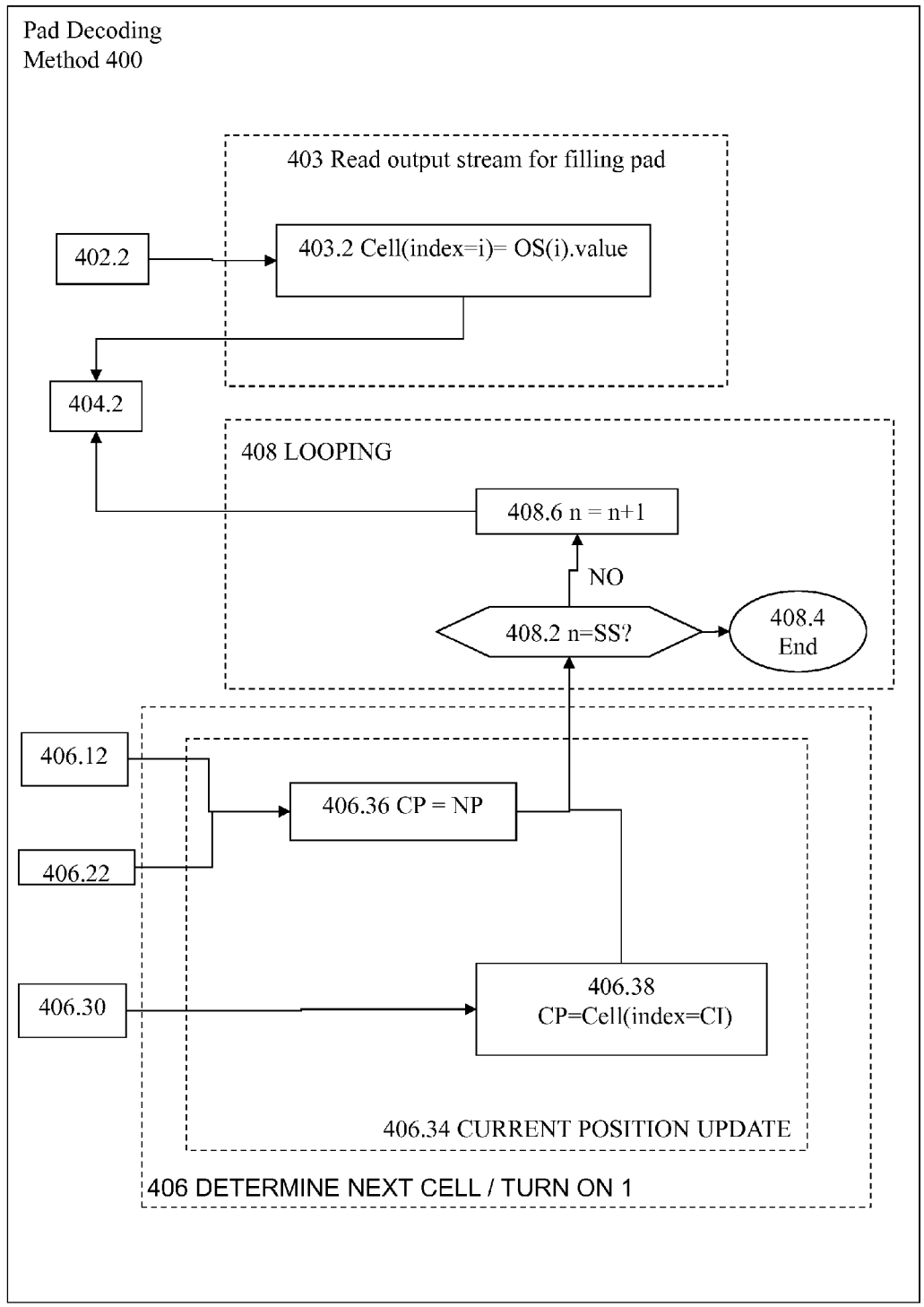

Referring to FIGS. 4B and 4C example logical process steps 402.2 to 414.4 of a more detailed embodiment is described.

Step 402.2 is for acquiring further detail of the two dimensional shape (for example a rectangular pad) including initial values for: initial position (IP); initial direction (ID); turn direction (TD); escape direction (ED); index table (IT) and string size (SS). The input string (IS) is measured for a length and the measurement value stored as <<String Size>> (SS). The pad dimension is specified by a <<Pad Width>> (PW) and a <<Path Height>> (PH). SS needs to be less than or equal to the numbers of cells in the two dimensional shape and in a rectangular shape having width and height SS needs to be less than or equal to PW*PH. Each position of the two dimensional shape is identified with an index specified in an <<Index Table>> (IT) Each position of the input string is indexed by n and the initial value of n is one. Next step 403.2.

Step 403.2 is for reading each character in the output string (OS) and then traversing through each cell in the two dimensional shape in a predetermined order and writing the character in the traversed cell. For example, this can be represented by Cell(index=i)=Outputstring (i).value. Next step 404.2.

Step 404.2 is for reading the value of the current position (CP) to the Input Strings nth character. The status of the current position CP is set from busy to idle. Next step 406.2.

Step 406.2 is for moving to step 406.4 if the input string character IS(n) is one but otherwise step 406.6 and 406.8 if not. The example in the detail embodiment is a binary string but any number base or string character can be used as long as there is a condition of that allows for a change of direction.

Step 406.4 for changing the direction by adding a directional unit (in this case TD) to the current direction (CD). Next step 406.8.

Step 406.6 is for searching for the next position and comprises steps 406.8 to 406.14.

Step 406.8 is for setting a next position (NP) to the current position (CP). Next step 406.10.

Step 406.10 is for setting the next position as a function of the existing next position (NP) and the current direction (CD). Next step 406.12.

Step 406.12 is for moving to step 406.36 if the next position status is busy otherwise branching to step 406.14.

Step 406.14 is for branching to step 406.16 and 406.18 if the next position has reverted to the current position otherwise branching back to step 406.10.

Step 406.16 is for escaping a turn for a busy line or column after a few too many turns result in a loop that would continuous turn without finding a new cell that is idle or not being used already and comprises steps 406.18 to 406.24.

Step 406.18 is for changing the current direction (CD) by an extended direction (ED). Next step 406.12.

Step 406.20 is for changing the next position as a function of the position and the current direction (having being changed by the extended direction).

Step 406.22 is for moving to step 406.36 if the next position is busy otherwise the method continues at step 406.24.

Step 406.24 is for branching to step 406.28 if the next position is the current position otherwise method continues at step 406.18.

Step 406.26 is for further escaping a turn for a busy line or column after too many turns still result in a loop that would continuous turn without finding a new cell that is idle or not being used already. Step 406.26 comprises three sub steps 406.28, 406.30 and 406.32.

Step 406.28 is for setting a current index (CI) to a function of the current position (CP) and the string size. For example, CI=1+CP.index mod SS. Next step 406.30.

Step 406 30 is for branching to step 406.38 if the cell status for the current index CI is idle otherwise the method continues at step 406.32.

Step 406.32 is for incrementing the current index and then looping back to step 406.28 to find a cell that is idle and ready for writing.

Step 406.34 is for updating the current position and comprising steps 406.36 and 406.38.

Step 406.36 is for setting the current position to the new position when the method passes from step 406.30. Next step 408.2.

Step 406.38 is for setting the current position to the cell with the current index when the method passes from step 406.12 or step 406.22. Next step 408.2.

Step 408.2 is for branching to step 408.4 if the number of characters in the string have been reached otherwise step 408.6.

Step 408.4 is the end of decoding method 400.

Step 408.6 is for incrementing character counter n. Next step 404.2.

Referring to FIG. 5A, an example of a raw stream and a coded stream is described. The raw stream can be seen on the left of the figure to be a sequence of ascending numbers from 1 to F hexadecimal and 0000 to 1111 in binary. To the right of the figure, a coded stream of numbers is shown in binary and in hexadecimal.

FIG. 5B is an example set of initial parameters used to code the example of FIG. 5A. Initial position (IP)=1; initial direction (ID)=east; turn direction (TD)=east; escape direction (ED)=east; pad width (PW)=8; pad height (PH)=8; and string size (SS)=64.

Figure 6A:
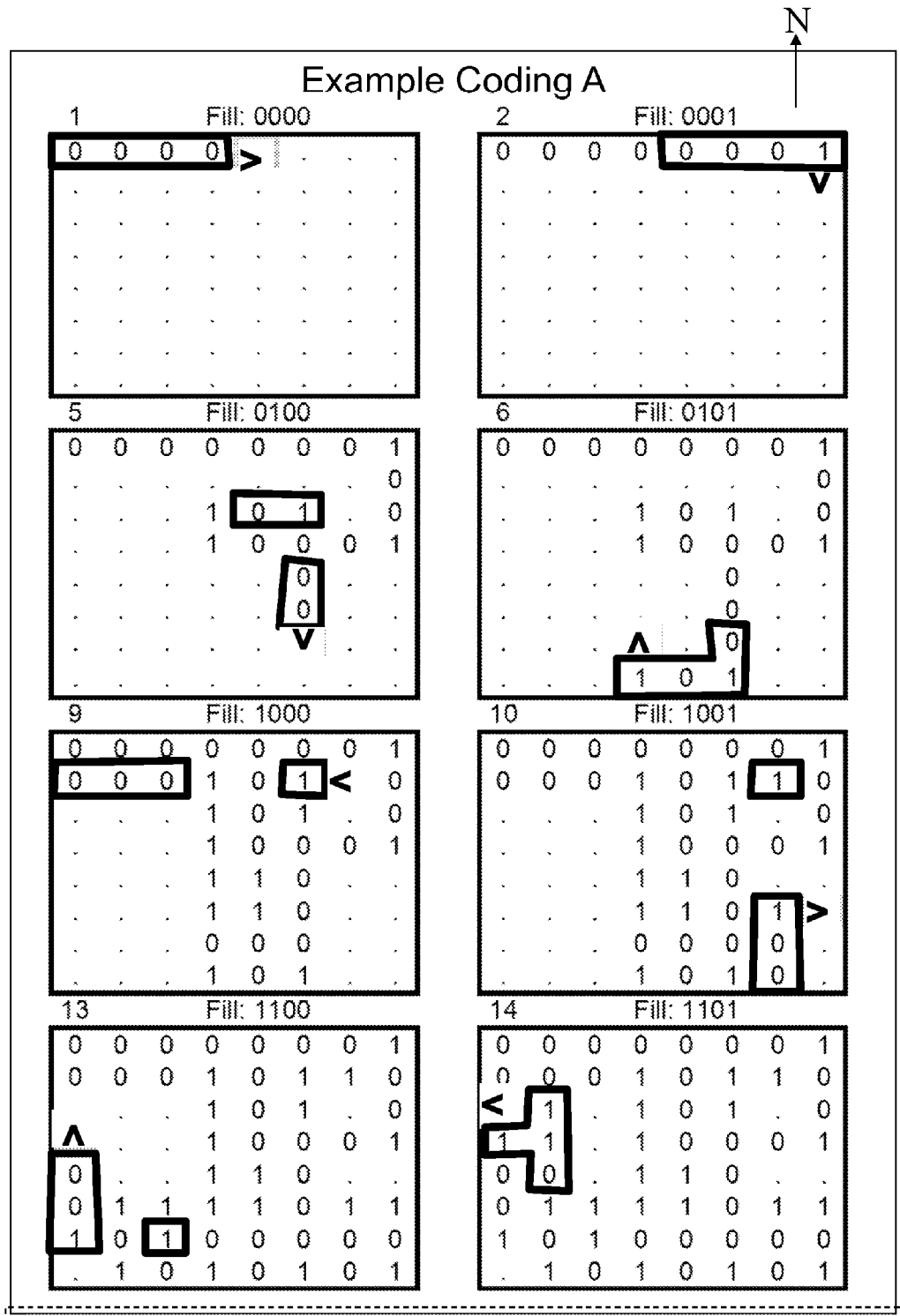
FIGS. 6A and 6B are state diagrams of an example pad as it is used to code the raw stream to the coded stream of FIG. 5A.
Figure 6B:
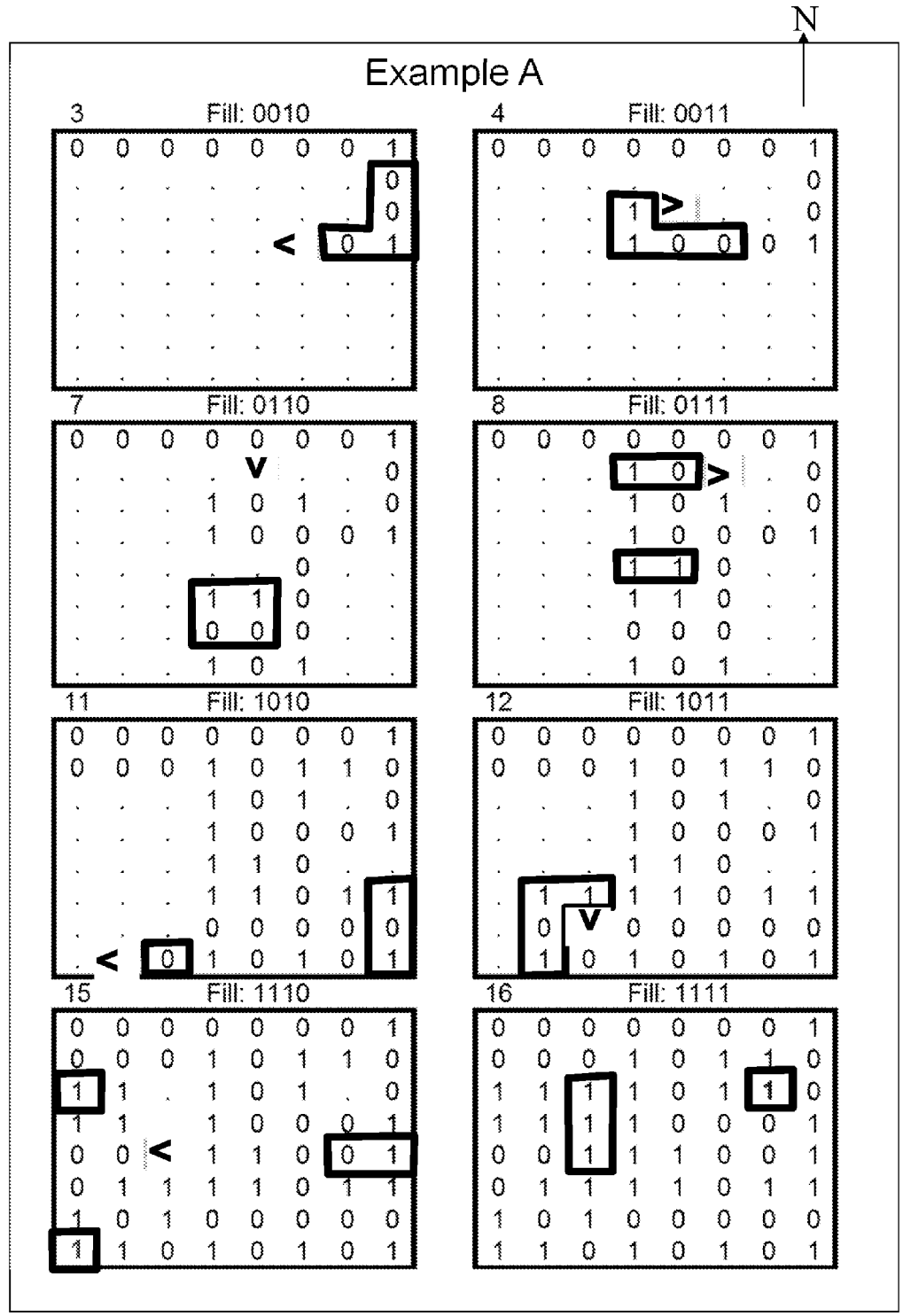

FIGS. 6A and 6B show states of an example pad as it is used to code the raw stream to the coded stream of the example of FIG. 5A. Sixteen pad states are shown numbered 1 to 16. A compass points north on the page. A two dimension shaped is defined as in FIG. 5B with pad width and pad height set at 8 cells.

The input string is a progression from 0 to 15 represented in binary as follows. "0000000100100011010001010101100-1111000100110101011110011011110111 1"

The $1^{st}$ pad state shows a mostly empty pad with a horizontal line of "0000" binary characters starting east from initial position 1 with a cursor pointing east at the end of the line. This corresponds to writing the first binary character of the binary number "0" on the pad starting at initial position (IP)=1 and moving in an initial direction of east (with north defined as straight up the pad as shown). The next cell is determined by parsing east to locate an idle cell to the east. The method loops back to the writing step whereby the $2^{nd}$ character "0" is written to an adjacent east cell. This is repeated two more times as idle cells are determined east and east again such that "0000" is written in a continuous line running east. The next idle cell is also determined as east and the turn direction (TD) (see arrow in pad 1) remains set to east.

The $2^{nd}$ pad shows a horizontal blocked line of "0001" going east four cells from the last position. This corresponds to writing the first character of the number "0001" on the pad starting at initial position (IP)=5 and moving in an initial direction of east. The next cell is determined by parsing east again and finding an idle cell directly to the east. The method loops back to the writing step whereby the $2^{nd}$ character "0" is written to an adjacent easterly cell. This is repeated two more times as idle cells are determined east and east again such that "0001" is written in a continuous line running east. However, searching for the first idle cell for the next sequence of binary characters is not started easterly because the last write was a "1" and the example rule is to change direction clockwise on writing "1" (moreover there is a boundary). Therefore the TD direction (see arrow) is changed to south. (by incrementing a direction pointer) where there is no boundary. Coincidentally the edge of the boundary was reached and the direction would have also changed clockwise in this example to avoid the boundary.

The $3^{rd}$ pad shows binary characters "0010" traversing south three cells and west one cell (see FIG. 6B). This corresponds to writing the first, second and third characters of the string "0010" with the direction set to south whereupon writing a 1 then incrementing the direction to west. The next cells are determined by parsing and finding an idle cells in the direction of the parse. The method loops back to the writing step whereby the 4th character "0" is written to the adjacent westerly cell and the TD remains pointing west.

The $4^{th}$ pad shows binary characters "0011" written into idle cells traversing west three cells, north one cell and changing TD to east because the northern cell was busy.

The $5^{th}$ pad shows binary characters "01" written into two easterly idle cells; incrementing TD to south because of a "1" character; skipping a single busy southerly cell and binary characters "00" written into two southerly idle cells and wherein TD remains set to south.

The $6^{th}$ pad shows binary characters "0101" written into adjacent cells from the last written cell traversing south, south west and west. After the last binary character "1" is written TD is changed to north.

The $7^{th}$ pad shows binary characters "0110" written in cells from the last written cell and traversing north, north, east, south. After the last binary character "1" is written, TD is changed to south and the next idle cell is selected along the south line through the boundary (as shown by the south pointing arrow).

The $8^{th}$ pad shows binary character "0111" written as: "0" in the next idle cell; traversing south three cells and writing "1"; changing TD to east and traversing east one cell to write "1", changing TD to north and traversing three cells to write "1"; changing TD to east and traversing two cells to find the next idle cell.

The $9^{th}$ pad shows binary characters "0001" written as "1" in the next idle cell and changing TD to south. However, there are no idle cells in the north south lines of cells so TD is changed again to west. Two cells are traversed west and "0" written, traverse west one cell and "0" is written, traverse west one cell and "0" is written. Traversing west touches the boundary so starting from east side of the east west line traversing two cells west to find the a new idle cell.

The $10^{th}$ pad shows binary characters "1001" written as "1" in the new idle cell and changing TD to north. Traversing north touches the boundary so from the south side of the column and traversing north one cell to find an idle cell for writing "0". North one cell and "0" is written. North one cell and "1" is written, TD is changed to east and the new idle cell is one cell east as shown by the east pointing arrow.

The $11^{th}$ pad shows binary characters "1010" written as "1" in the new idle cell, changing TD to south and traversing south one cell. "0" is written and one cell traversed south. "1" is written, TD is changed to west, and five cells traverse west. "0" is written and one cell traversed west to the new idle cell. TD is west as shown by the west pointing arrow in the new idle cell.

The $12^{th}$ pad shows binary characters "1011" written as "1" in the new idle cell, changing TD to north and traversing one cell. "0" is written and one cell traversed north. "1" is written, TD is changed to east and one cell traversed east "1" is written, TD is changed to south and one cell traversed south to the new idle cell. TD is south as shown by the south pointing arrow in the new idle cell.

The $13^{th}$ pad shows binary characters "1100" written as "1" in the new idle cell, changing TD to west and traversing west two cells. "1" is written, TD is changed to north and one cell traversed north. "0" is written and one cell traversed north. "0" is written and one cell traversed north to the new idle cell. TD is north as shown by the north pointing arrow in the new idle cell.

The 14th pad show binary characters "1101" written as "1" in the new idle cell, changing TD to east and traversing one cell east. "1" is written, TD is changed to south and one cell traversed south. "0" is written and three cells traversed south from the north end of the column. "1" is written, TD is changed to west and one cell traversed west to the new idle cell. TD is west as shown by the west pointing arrow in the new idle cell.

The 15th pad shows binary characters "1110" written as "1" in the new idle cell, changing TD to north and traversing to the only idle cell at the south of the north south line. "1" is written, TD is changed to east and searching the row east to find no idle cells, searching the column south to find no idle cells. Traversing one cell west and searching the column north and traversing four cells north. "1" is written, TD is changed east and moving one cell east. Writing "0", traversing four cells west to the new idle cell. TD is west as shown by the west point arrow in the new idle cell.

The 16th pad shows binary characters "1111" written as "1" in the new idle cell, changing TD to north and traversing one cell north, "1" is written and TD changed to east but no idle cells are located in the east line. TD is changed to south and traversing to the only idle cell in the column. "1" is written and TD changed to west and traversing to the only idle cell in the row. "1" is written and there are no more binary characters to write.

Serializing the binary characters from top to bottom (north to south) and from left to right (west to east) renders an encoded string "000000010001011011111011011111000100-11100101111011101000001101010 1".

Figure 7A:
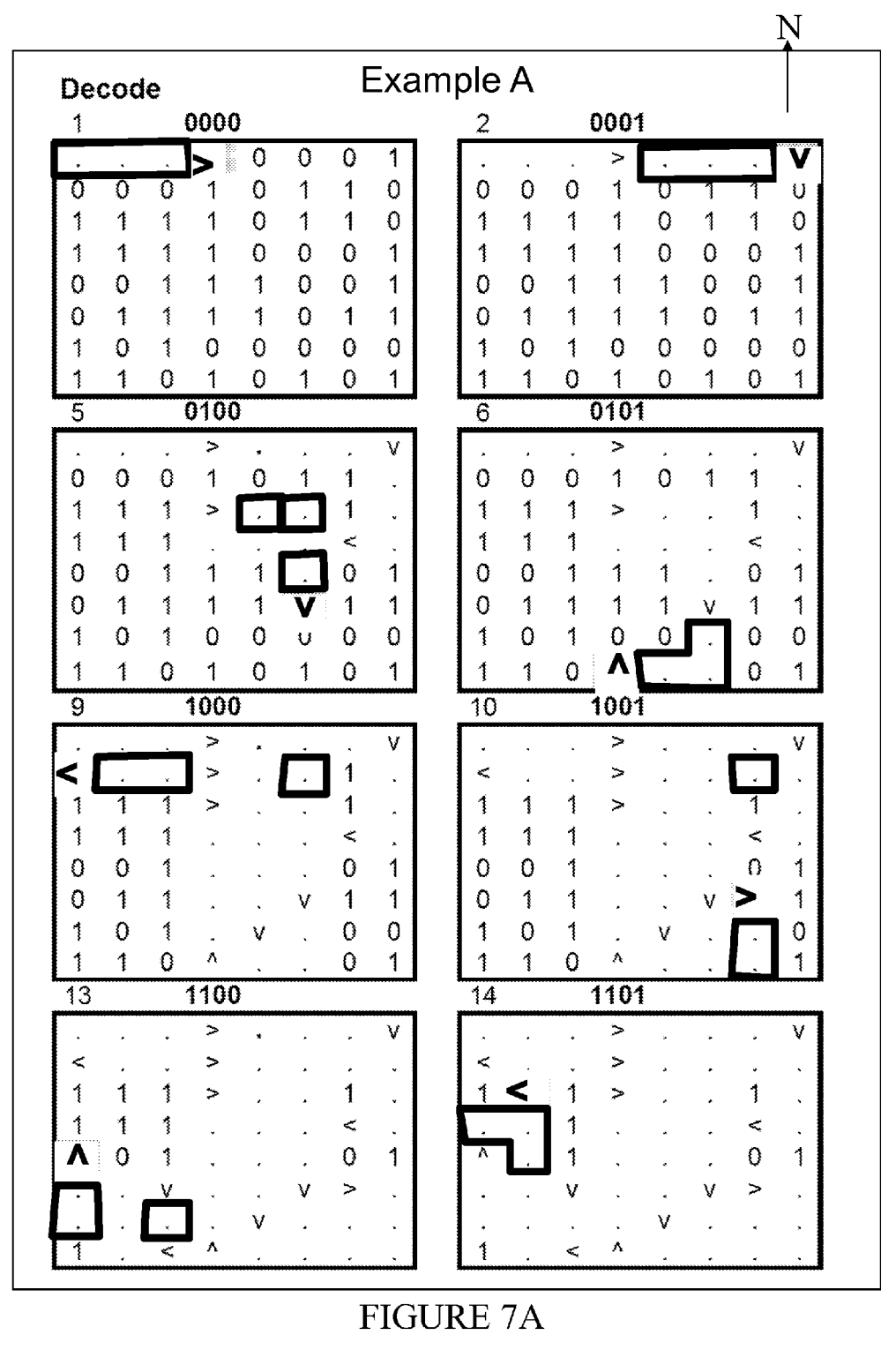
Figure 7B:
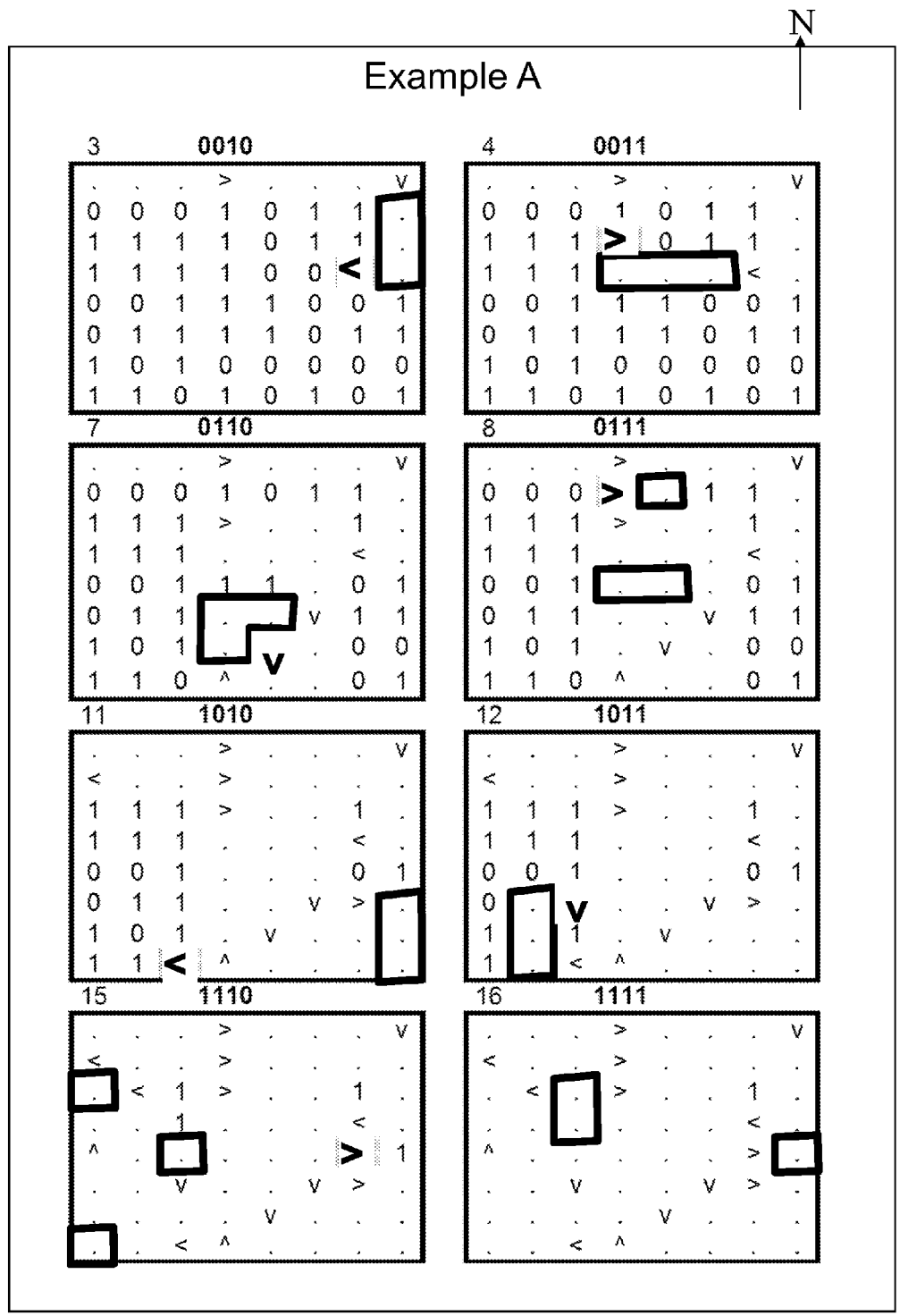
Figure 8:
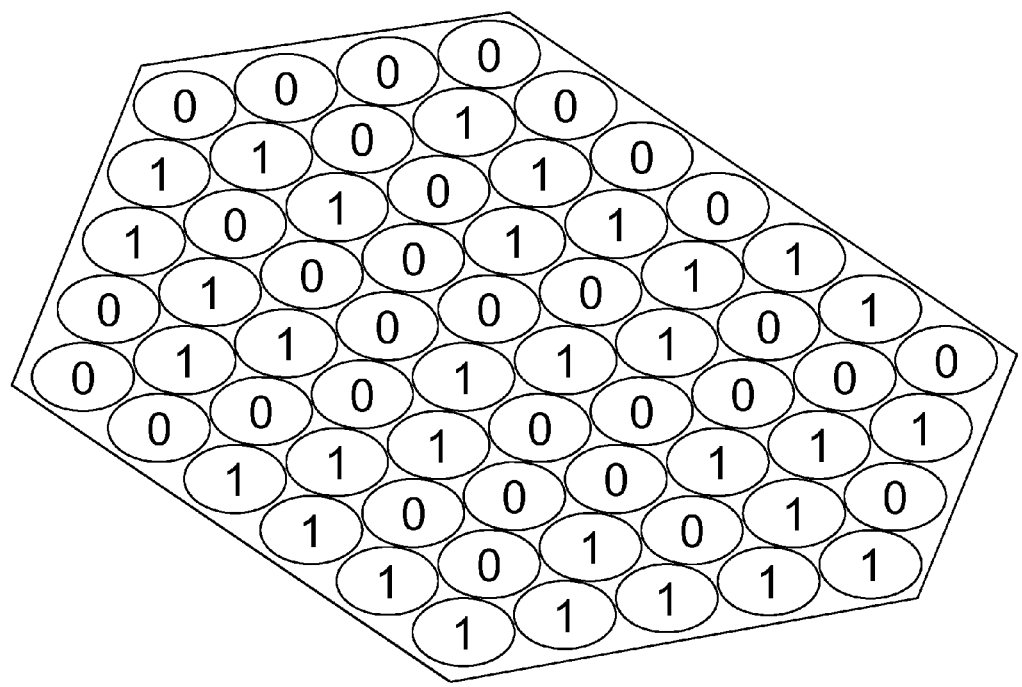
FIG. 8 is shape diagram of a honeycomb two dimensional shape.

FIGS. 7A and 7B show states of an example pad as it is used to decode the encoded stream to the stream of the example of FIG. 5A. Sixteen pads are shown numbered 1 to 16. A compass points north on the page.

The first stage is to de-serialize the encoded string by writing it into a pad. As can be seen in pad state 1 of FIG. 7A the encoded string has been written from left to right and from top to bottom.

Decoding uses the opposite method to encoding. The encoding method traverses the cells in a pad until an idle cell is reached whereby a binary character is written into the idle cell and changes its status to busy. In contrast the decoding method traverses a pad until a busy cell is reached, a character is read and the cell status changed to idle.

The 1st pad state shows a mostly full pad with a horizontal line of "0000" binary characters having been read from initial position 1 (top left corner) with a cursor pointing east at the end of the line. This corresponds to reading the first character of the binary number "0" on the pad starting at initial position (IP)=1 and moving in an initial direction of east (with north defined as straight up the pad as shown). The next cell is determined by traversing east to locate a busy cell. The method loops back to the reading step whereby the 2nd character "0" is read. This is repeated two more times as busy cells are determined east and east again such that "0000" is read in a continuous line running east. The TD direction (see arrow in pad 1) remains set to east.

In the 2nd pad state the next busy cell is determined as an east cell. The 2nd pad state shows a horizontal blocked line of "0001" having been read from four east cells from the last position (referenced by the cursor from the 1st pad state). This corresponds to reading the first character of the number "0001" on the pad starting at initial position (IP)=5 and moving in an initial direction of east. The next cell is determined by traversing east and finding a busy cell. The method loops back to the reading step whereby the 2nd character "0" is read from the cell. This is repeated two more times as busy cells are determined east and east again such that "0001" is read in a continuous line running east. However, searching for the first busy cell for the next sequence of binary characters is not started easterly because the last read was a "1" and the example rule is to change direction clockwise on reading "1". Therefore the TD direction (see arrow) is changed to south by incrementing a direction pointer. Coincidentally the edge of the boundary was reached and the direction would have also changed clockwise in this example to avoid the boundary.

In the 3rd pad state the next busy cell is one cell south. The 3rd pad shows binary characters "0010" being read by traversing south three cells and west one cell (see FIG. 7B). This corresponds to reading the first, second and third characters of the string "0010" with the direction set to south whereupon reading a "1" then incrementing the direction to west. The next cells are determined by traversing and finding a busy cell in the direction of the traverse. The method loops back to the reading step whereby the 4th character "0" is read and the TD remains pointing west.

In the 4th pad state the next busy cell is one cell west. The 4th pad shows binary characters "0011" having been read from busy cells traversing west three cells, north one cell and changing TD to east because the northern cell was idle.

In the 5th pad state the next busy cell is one cell east. The 5th pad shows binary characters "01" read from two easterly idle cells; incrementing TD to south because of a "1" character; skipping a single busy southerly cell and reading binary characters "00" from two southerly idle cells and wherein TD remains set to south.

The 6th pad shows binary characters "0101" read from adjacent cells from the last read cell traversing south, then south west and west. After the last binary character "1" is read TD is changed to north.

The 7th pad shows binary characters "0110" read from cells from the last read cell and traversing north, then north, east, and south. After the last binary character "1" is read, TD is changed to south.

In the 8th pad, the next busy cell is selected along the south line through the boundary (as shown by the south point arrow in the 7th pad. The 8th pad shows binary characters "0111" read as: "0" in the next idle cell; traversing south three cells and reading "1"; changing TD to east and traversing east one cell to read "1", changing TD to north and traversing three cells to read "1"; changing TD to east.

In the 9th pad, the method traverses two cells to find the next busy cell. The 9th pad shows binary characters "0001" read as "1" in the next busy cell and changing TD to south. However, there are no busy cells in the north south lines of cells so TD is changed again to west. Two cells are traversed west and "0" read, traverse west one cell and "0" is read, traverse west one cell and "0" is read.

In the 10th pad, the method starts from east side of the east west line traversing two cells west to find the a new busy cell because traversing west touches the boundary. The 10th pad shows binary characters "1001" read as "1" in the new busy cell and changing TD to north. Traversing north touches the boundary so starting from the south side of the column and traversing north one cell and "0" is read. North one cell and "0" is written. North one cell, "1" is written, TD is changed to east.

In the 11th pad, the new busy cell is one cell east as shown by the last arrow (pointing east) from the 10th pad. The 11th pad shows binary characters "1010" read as "1" in the new idle cell, changing TD to south and traversing south one cell. "0" is read and one cell traversed south. "1" is read, TD is changed to west, and five cells traverse west. "0" is read and one cell traversed west to the new idle cell. TD is west as shown by the west pointing arrow.

The 12$^{th}$ pad shows binary characters "1011" read as "1" from the new busy cell, changing TD to north and traversing one cell. "0" is read and one cell traversed north. "1" is read, TD is changed to east and one cell traversed east. "1" is read, TD is changed to south and one cell traversed south to the new busy cell. TD is south as shown by the south pointing arrow.

The 13$^{th}$ pad shows binary characters "1100" read as "1" in the new busy cell, changing TD to west and traversing west two cells. "1" is read, TD is changed to north and one cell traversed north. "0" is read and one cell traversed north. "0" is read and one cell traversed north to the new busy cell. TD is north.

The 14$^{th}$ pad show binary characters "1101" read as "1" in the new busy cell, changing TD to east and traversing one cell east. "1" is read, TD is changed to south and one cell traversed south. "0" is read and three cells traversed south from the north end of the column. "1" is read, TD is changed to west.

The 15$^{th}$ pad shows binary characters "1110" read as "1" in the new busy cell, changing TD to north and traversing to the only busy cell at the south of the north south line. "1" is read, TD is changed to east and searching the row east to find no busy cells, searching the column south to find no busy cells. Traversing one cell west and searching the column north and traversing four cells north. "1" is read, TD is changed east and moving one cell east. "0" is read before traversing four cells west to the new busy cell. TD is west.

The 16$^{th}$ pad shows binary characters "1111" read as "1" in the new busy cell, changing TD to north and traversing one cell north, "1" is read and TD changed to east but no busy cells are located in the east line. TD is changed to south and traversing to the only busy cell in the column. "1" is read and TD changed to west and traversing to the only busy cell in the row. "1" is read and there are no more binary characters to read.

At the first point the output string contains all the read characters in the special order presented by the decoder and this is the same as the original input string that was first coded.

Further embodiments of the invention are now described. It will be clear to one of ordinary skill in the art that all or part of the logical process steps of the embodiment may be alternatively embodied in a logic apparatus, or a plurality of logic apparatus, comprising logic elements arranged to perform the logical process steps of the method and that such logic elements may comprise hardware components, firmware components or a combination thereof.

It will be equally clear to one of skill in the art that all or part of the logic components of the embodiment may be alternatively embodied in logic apparatus comprising logic elements to perform the steps of the method, and that such logic elements may comprise components such as logic gates in, for example, a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising steps of deploying computer program code operable to, when deployed into a computer infrastructure and executed thereon, cause the computer system to perform all the steps of the method.

It will be appreciated that the method and components of the embodiment may alternatively be embodied fully or partially in a parallel computing system comprising two or more processors for executing parallel software.

A further embodiment of the invention is a computer program product defined in terms of a system and method. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fibre-optic cable), or electrical signals transmitted through a wire.

Computer-readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibres, wireless transmission, routers, firewalls, switches, gateway computers and/or edge servers. A network adapter card or network interface in each computing/processing device receives computer-readable program instructions from the network and forwards the computer-readable program instructions for storage in a computer readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++ or the like, and conventional procedural programming languages, such as the C programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be clear to one skilled in the art that many improvements and modifications can be made to the foregoing exemplary embodiment without departing from the scope of the present invention.

The invention claimed is:

1. A system for encoding an input string of binary characters representing alphanumeric characters, comprising:
   a register for storing a two dimensional cellular shape definition including a starting empty cell;
   a character writing engine for writing a binary character to an empty cell beginning with the starting empty cell;
   a next cell determination engine for determining a next empty cell by methodically traversing neighboring cells in the two dimensional shape until an empty cell is located;
   a loop facilitator for looping back to the character writing engine and the next cell determining engine until there are no more data characters or a next empty cell is not determined; and
   a serialization engine for methodically serializing the two dimensional cells into a one dimensional binary string of characters representing an encoded string of alphanumeric characters.

2. A system according to claim 1, wherein methodically traversing comprises moving from the current cell in a current direction to a new cell and wherein the new cell is the next cell if the new cell is an empty cell otherwise traversing again until an empty cell is located.

3. A system according to claim 1, further comprising changing a direction of traversing to locate an empty cell.

4. A system according to claim 1, further comprising traversing to adjacent cells to locate a next cell but if no neighboring cells are empty then traversing to a non-neighboring cell to locate an empty cell.

5. A system according to claim 1, further comprising changing a current direction of traversing if a particular binary character has been written.

6. A system according to claim 1, further comprising using a different direction if traversing in a current direction would cross the boundary of the two dimensional shape.

7. A system according to claim 6, wherein the current direction changes to an opposite direction if the current direction would hit the edge of the two dimensional shape.

8. A system for decoding an input string of binary characters representing an encoded string of alphanumeric characters, comprising:
   a register for storing a two dimensional shape definition of regular cells including a starting current cell;
   a serialization de-serialization engine for populating the cells with the binary characters using a defined transform so that each populated cell is full;
   a character reading and writing for reading a binary character from the current cell; writing it to an output string, and setting the current cell to empty;
   a next cell determination engine for determining a next full cell by methodically traversing from the current cell to adjacent cells in the two dimensional shape until a full cell is located;
   a loop facilitator for looping back to the reading next character step and the determining next cell step until there are no more data characters or a next full cell is not determined; and whereby the output string is a dimensional binary string of characters representing an encoded string of alphanumeric characters.

9. A method of encoding an input string of binary characters representing alphanumeric characters, comprising:
   defining a two dimensional shape of regular cells including a starting empty cell;
   writing a binary character to an empty cell beginning with a starting empty cell;
   determining a next empty cell by methodically neighboring cells in the two dimensional shape until an empty cell is located;

looping back to the writing next character step and the determining next cell step until there are no more data characters or a next empty cell is not determined; and methodically serializing the two dimensional cells into a one dimensional binary string of characters representing an encoded string of alphanumeric characters.

10. A method according to claim 9, wherein methodically traversing comprises moving from the current cell in a current direction to a new cell and wherein the new cell is the next cell if the new cell is an empty cell otherwise traversing again until an empty cell is located.

11. A method according to claim 9, further comprising changing a direction of traversing to locate an empty cell.

12. A method according to claim 9, further comprising traversing to adjacent cells to locate a next cell but if no neighboring cells are empty then traversing to a non-neighboring cell to locate an empty cell.

13. A method according to claim 9, further comprising changing a current direction if a particular binary character has been written.

14. A method according to claim 9, further comprising using a different direction if traversing in a current direction would cross the boundary of the two dimensional shape.

15. A method according to claim 14, wherein the current direction changes to an opposite direction if the current direction would hit the edge of the two dimensional shape.

16. A method according to claim 9, wherein the two dimensional shape is a rectangle having width and height or a honeycomb matrix of six sided cells.

17. A method according to claim 9, wherein the cells have an initial filled in pattern.

18. A method of decoding an input string of binary characters representing an encoded string of alphanumeric characters comprising:

defining a two dimensional shape of regular cells including a starting current cell;

populating the cells with the binary characters using a defined transform so that each populated cell is full;

reading a binary character from the current cell; writing it to an output string, and setting the current cell to empty;

determining a next full cell by methodically traversing from the current cell to adjacent cells in the two dimensional shape until a full cell is located;

looping back to the reading next character step and the determining next cell step until there are no more data characters or a next full cell is not determined; and methodically serializing the two dimensional cells into a one dimensional binary string of characters representing an encoded string of alphanumeric characters.

19. A computer program stored on a computer readable medium and loadable into the internal memory of a digital computer, comprising software code portions, when said program is run on a computer, for performing the method of claim 9.

20. A computer program stored on a computer readable medium and loadable into the internal memory of a digital computer, comprising software code portions, when said program is run on a computer, for performing the method of claim 18.

* * * * *